(12) United States Patent
Hultermans et al.

(10) Patent No.: US 8,890,099 B2
(45) Date of Patent: Nov. 18, 2014

(54) RADIATION SOURCE AND METHOD FOR LITHOGRAPHIC APPARATUS FOR DEVICE MANUFACTURE

(75) Inventors: Ronald Johannes Hultermans, Waalre (NL); Antonius Theodorus Wilhelmus Kempen, Rosmalen (NL); Bernard Van Essen, Brielle (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 14/342,007

(22) PCT Filed: Jul. 27, 2012

(86) PCT No.: PCT/EP2012/064779
§ 371 (c)(1), (2), (4) Date: Feb. 28, 2014

(87) PCT Pub. No.: WO2013/029896
PCT Pub. Date: Mar. 7, 2013

(65) Prior Publication Data
US 2014/0209817 A1 Jul. 31, 2014

Related U.S. Application Data

(60) Provisional application No. 61/530,802, filed on Sep. 2, 2011.

(51) Int. Cl.
*H05G 2/00* (2006.01)
*G03F 7/20* (2006.01)
*H01L 25/13* (2006.01)

(52) U.S. Cl.
CPC .............. *H05G 2/006* (2013.01); *H05G 2/008* (2013.01); *Y10S 430/146* (2013.01)
USPC ............... 250/504 R; 250/503.1; 250/493.1; 430/30; 430/945; 355/67; 355/77

(58) Field of Classification Search
CPC ....... H01L 25/0753; H01L 25/13; G03F 7/20; G03F 7/70033; G03F 7/70133; G03F 7/70041; G03F 7/70175; G03F 7/70558; G03F 7/70575; G03F 7/70916; G03F 7/70983; H05G 2/003; H05G 2/008; H05G 2/005; H05G 2/006
USPC .......... 250/493.1, 503.1, 504 R; 430/30, 945; 355/67, 77
See application file for complete search history.

(56) References Cited

U.S. PATENT DOCUMENTS 5,139,238 A 8/1992 Buhr
7,524,097 B2 * 4/2009 Turnbull et al. .............. 362/545
(Continued)

FOREIGN PATENT DOCUMENTS

DE 33 40 417 A1 5/1985
EP 0 452 654 A2 10/1991
(Continued)

OTHER PUBLICATIONS

International Search Report directed to related International Patent Application No. PCT/EP2012/064779, mailed Sep. 25, 2012; 4 pages.
(Continued)

*Primary Examiner* — David A Vanore
(74) *Attorney, Agent, or Firm* — Sterne, Kessler, Goldstein & Fox P.L.L.C

(57) ABSTRACT

A radiation source for generating EUV from a stream of molten metal fuel droplets by LPP (Laser Produced Plasma) or (Dual Laser Plasma) has a fuel droplet generator arranged to provide a stream of droplets of fuel and at least one laser configured to vaporise at least some of said droplets of fuel, whereby radiation is generated. The fuel droplet generator has nozzle, fuel supply line, and reservoir, with a pumping device arranged to supply a flow of molten metal fuel from the reservoir through the fuel feed line and out of the nozzle as a stream of droplets. The fuel droplet generator has a replaceable filter assembly in the fuel feed line, arranged to filter the molten metal fuel in use, to deter nozzle blockage by solid particulate impurities in the fuel.

20 Claims, 3 Drawing Sheets

(56) References Cited

U.S. PATENT DOCUMENTS

| | | |
|---|---|---|
| 8,416,391 B2 * | 4/2013 | Banine et al. ............... 355/67 |
| 8,431,916 B2 * | 4/2013 | Loopstra et al. ......... 250/504 R |
| 8,663,881 B2 * | 3/2014 | Buurman et al. ............. 430/30 |
| 2003/0156425 A1 * | 8/2003 | Turnbull et al. ............ 362/545 |
| 2006/0192153 A1 | 8/2006 | Bykanov et al. |
| 2010/0110405 A1 * | 5/2010 | Loopstra et al. ............. 355/67 |
| 2010/0176542 A1 | 7/2010 | Juma |
| 2010/0200776 A1 | 8/2010 | Yabu et al. |
| 2010/0258748 A1 | 10/2010 | Vaschenko et al. |
| 2011/0024651 A1 * | 2/2011 | Schimmel et al. ........ 250/504 R |
| 2011/0134405 A1 * | 6/2011 | Banine et al. ................. 355/67 |
| 2013/0022901 A1 * | 1/2013 | Buurman et al. ............. 430/30 |
| 2013/0077069 A1 * | 3/2013 | Mestrom et al. ............. 355/67 |
| 2013/0077071 A1 * | 3/2013 | Van Den Akker et al. ...... 355/67 |
| 2013/0077073 A1 * | 3/2013 | Van Schoot et al. ........... 355/67 |

FOREIGN PATENT DOCUMENTS

| | | |
|---|---|---|
| WO | WO 2006/093687 A1 | 9/2006 |
| WO | WO 2010/112048 A1 | 10/2010 |
| WO | WO 2011/098169 A1 | 8/2011 |

OTHER PUBLICATIONS

International Preliminary Report on Patentability and Written Opinion of the International Searching Authority directed to related International Patent Application No. PCT/EP2010/064779, mailed Mar. 4, 2014; 8 pages.

* cited by examiner

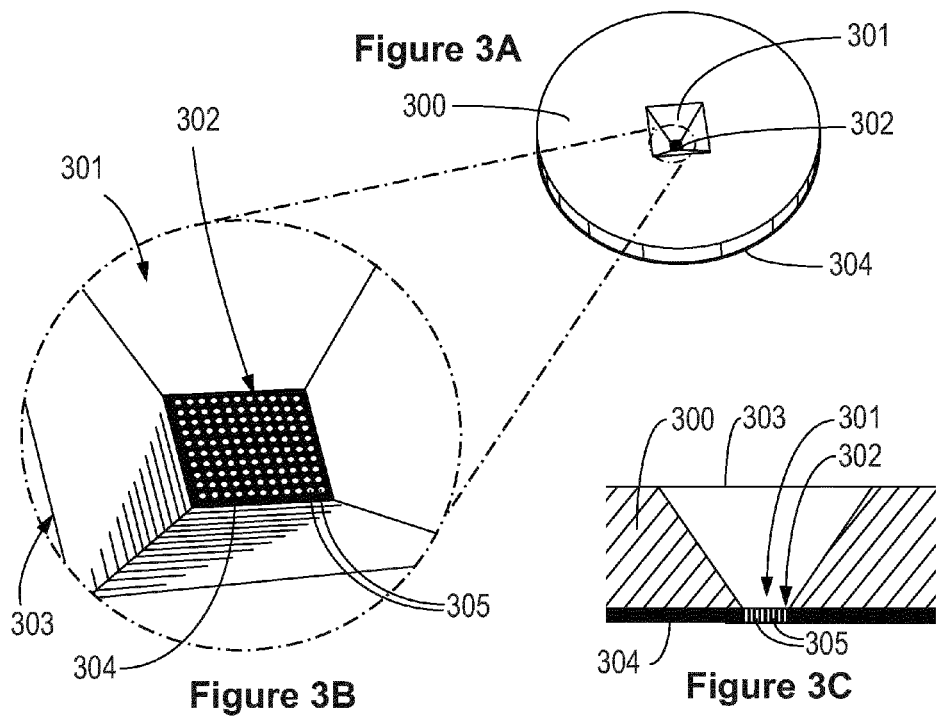
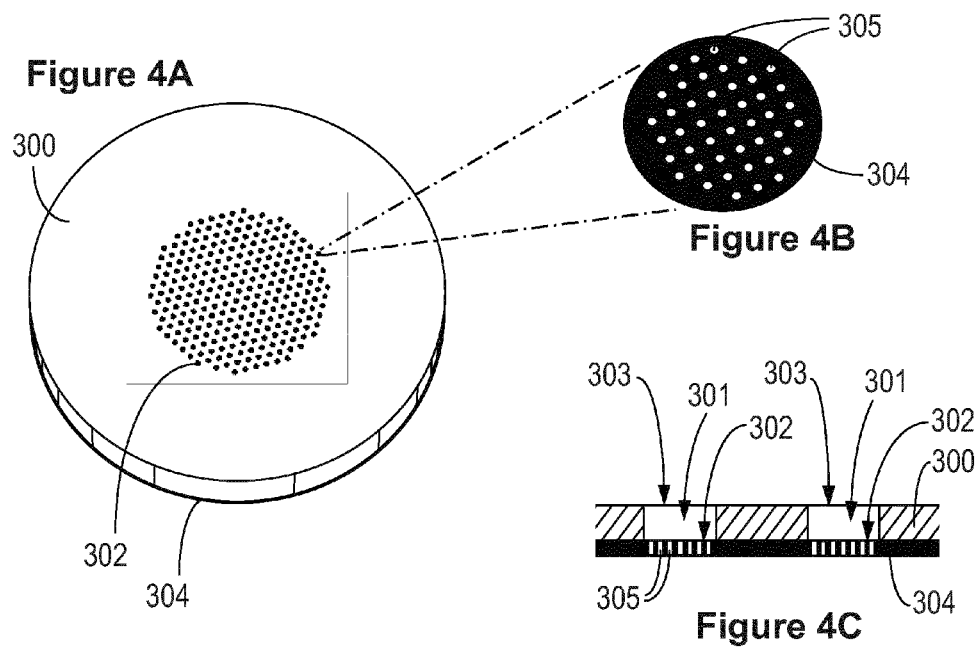

RADIATION SOURCE AND METHOD FOR LITHOGRAPHIC APPARATUS FOR DEVICE MANUFACTURE

CROSS-REFERENCE TO RELATED APPLICATIONS

This application claims the benefit of U.S. provisional application 61/530,802, which was filed on Sep. 2, 2012, and which is incorporated herein in its entirety by reference.

FIELD

The present invention relates to an EUV radiation source, lithographic apparatus and methods for manufacturing devices.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA} \quad (1)$$

where $\lambda$ is the wavelength of the radiation used, NA is the numerical aperture of the projection system used to print the pattern, $k_1$ is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture NA or by decreasing the value of $k_1$.

In order to shorten the exposure wavelength and, thus, reduce the minimum printable size, it has been proposed to use an extreme ultraviolet (EUV) radiation source. EUV radiation is electromagnetic radiation having a wavelength within the range of 5-20 nm, for example within the range of 13-14 nm, for example within the range of 5-10 nm such as 6.7 nm or 6.8 nm. Possible sources include, for example, laser-produced plasma sources, discharge plasma sources, or sources based on synchrotron radiation provided by an electron storage ring.

EUV radiation may be produced using a plasma. A radiation system for producing EUV radiation may include a laser for exciting a fuel to provide the plasma, and a source collector module for containing the plasma. The plasma may be created, for example, by directing a laser beam at a fuel, such as particles or droplets of a suitable material (e.g., tin), or a stream of a suitable gas or vapour, such as Xe gas or Li vapour. The resulting plasma emits output radiation, e.g., EUV radiation, which is collected using a radiation collector.

The radiation collector may be a mirrored normal incidence radiation collector, which receives the radiation and focuses the radiation into a beam. The source collector module may include an enclosing structure or chamber arranged to provide a vacuum environment to support the plasma. Such a radiation system is typically termed a laser produced plasma (LPP) source.

When molten metal fuel droplets are used as fuel from which a radiation-generating plasma is produced, a second laser may also be provided to preheat the fuel droplets before the first laser beam and is incident upon the droplets in order to generate the plasma and subsequently the radiation. An LPP source that uses this approach may be referred to as a dual laser pulsing (DLP) source.

A fuel droplet generator may be arranged to provide a stream of droplets of molten metal fuel to a plasma formation location of the radiation source.

SUMMARY

Fuel droplets generators may comprise a nozzle through which molten metal fuel, typically molten metal such as tin, is driven under pressure to be injected from the nozzle as a stream of droplets. The fuel will typically enter the nozzle at an inlet orifice, from a fuel supply line, exiting through an outlet orifice of the nozzle.

The natural break-up of a stream of liquid issuing from a nozzle is known as Rayleigh break-up. The Rayleigh frequency, which corresponds to the rate of droplet production of the nozzle, is related to the mean velocity of the fuel at the nozzle and the diameter of the nozzle:

$$f_{Rayleigh} = \frac{\text{mean velocity}}{4.5 \text{ nozzle diameter}}$$

Although Rayleigh break-up of a stream of fuel may occur without excitation, a vibrator such as a piezoelectric actuator may be used to control the Rayleigh break-up by modulating or oscillating the pressure of molten metal fuel at the nozzle. Modulating the pressure inside the nozzle may modulate the exit velocity of the liquid fuel from the nozzle, and cause the stream of liquid fuel to break-up into droplets in a controlled manner directly after leaving the nozzle.

A nozzle used for generating fuel droplets is susceptible to blockage at the outlet orifice if particulate solid impurities are present in the supply of molten metal fuel that is fed to the inlet orifice of the nozzle from the fuel supply line. In particular, the outlet orifice of the nozzle, typically of a small cross-sectional area, may be blocked by such particulate solid impurities. Filters, such as porous, sintered (metal or ceramic) filters (of a metal or ceramic of higher melting point than the molten metal fuel) may be used to filter out particulate solid impurities by positioning such filters in the fuel supply line feeding molten metal fuel to the inlet orifice of the nozzle. However such porous sintered metal filters are prone to detachment of particulates from the filters themselves and such detached particles, say of metal or ceramic, from the filters themselves, may block the outlet orifice of the nozzle. There is a risk that metal or ceramic particles may detach from such sintered filters when the filter is replaced.

In use of a fuel droplet generator, it may be necessary to replace the nozzle and/or the filter. This process may lead to risk of particulate solid impurities being eroded from a sintered particulate filter and deposited inside the fuel droplet generator, and such impurities may subsequently lead to blockage of the nozzle.

One aim of the invention, amongst others, is to provide apparatus and methods for filtering molten metal fuels used for generation of streams of fuel droplets for use in lithographic radiation sources that address or overcome at least some of the problems set out above. In particular, it is an object of the invention to provide apparatus and methods that may be used to facilitate replacement of filters and/or nozzles in fuel droplet generators with reduced risk of subsequent nozzle blockage.

Throughout this specification, the term "comprising" or "comprises" means including the component(s) specified but not to the exclusion the presence of others. The term "consisting essentially of" or "consists essentially of" means including the components specified but excludes other components except for materials present as impurities, unavoidable materials present as a result of processes used to provide the components, and components added for a purpose other than achieving the technical effect of the invention.

Whenever appropriate, the use of the term "comprises" or "comprising" may also be taken to include the meaning "consists essentially of" or "consisting essentially of" and may also be taken to include the meaning of "consists of" or "consisting of."

Optional and/or preferred features as set out herein may be used either individually or in combination with each other where appropriate and particularly in the combinations as set out in the accompanying claims. The optional and/or preferred features for each aspect of the invention set out herein are also applicable to any other aspects of the invention, where appropriate.

A first aspect of the invention provides a radiation source comprising a fuel droplet generator arranged to provide a stream of droplets of fuel and at least one laser configured to vaporise at least some of said droplets of fuel, whereby radiation is generated, the fuel droplet generator comprising a nozzle, a fuel feed line, a reservoir, and a pumping device arranged to supply a flow of molten metal fuel from the reservoir through the fuel feed line and out of the nozzle as a stream of droplets, wherein the fuel droplet generator has a replaceable filter assembly in the fuel feed line, arranged to filter said molten metal fuel in use, the replaceable filter assembly comprising a rigid support plate having first and second opposed faces, with one or more channels, each extending from a respective first aperture in the first face through a respective second aperture in the second face, and supporting a filter membrane on the first face and extending over each first aperture of the first face, and wherein the filter membrane comprises mutually spaced holes therein, with each first aperture aligned with a plurality of the holes to provide fluid connection between the plurality of holes and the respective channel.

A second aspect of the apparatus provides a lithographic apparatus comprising the radiation source of the first aspect of the invention, arranged to generate a radiation beam, and further comprising an illumination system configured to condition the radiation beam, a support constructed to support a patterning device, the patterning device being capable of imparting the radiation beam with a pattern in its cross-section to form a patterned radiation beam, a substrate table constructed to hold a substrate, and a projection system configured to project the patterned radiation beam onto a target portion of said substrate.

It should be understood that the fuel droplet generator as described herein, which forms part of the radiation source of the first aspect of the invention, may be considered independently as an aspect of the invention in its own right.

Hence, a third aspect of the invention provides a fuel droplet generator for providing a stream of droplets of fuel for use in a radiation source for device lithography, the fuel droplet generator comprising a nozzle, a fuel feed line, a reservoir, and a pumping device arranged to supply a flow of molten metal fuel from the reservoir through the fuel feed line and out of the nozzle as a stream of droplets, wherein the fuel droplet generator has a filter assembly in the fuel feed line, arranged to filter said molten metal fuel in use, the filter assembly comprising a rigid support plate having first and second opposed faces, with one or more channels, each extending from a respective first aperture in the first face through a respective second aperture in the second face, and supporting a filter membrane bonded to the first face and extending over each first aperture of the first face, wherein the filter membrane comprises mutually spaced holes therein, with each first aperture aligned with a plurality of the holes to provide fluid connection between the plurality of holes and the respective channel.

A fourth aspect of the invention provides a method for filtering a molten metal fuel supply for a fuel droplet generator for providing a stream of droplets of molten metal fuel to provide a radiation source, by laser excitation, for device lithography, the fuel droplet generator comprising a nozzle, a fuel feed line, a reservoir, and a pumping device arranged to supply a flow of molten metal fuel from the reservoir through the fuel feed line and out of the nozzle as a stream of droplets, the method comprising inserting and retaining a replaceable filter assembly in the fuel feed line, arranged to filter the molten metal fuel in use, the replaceable filter assembly comprising a rigid support plate having first and second opposed faces, with one or more channels, each extending from a respective first aperture in the first face through a respective second aperture in the second face, and supporting a filter membrane on the first face and extending over each first aperture of the first face, wherein the filter membrane comprises mutually spaced holes therein, with each first aperture aligned with a plurality of the holes to provide fluid connection between the plurality of holes and the respective channel.

The radiation source of the invention will typically be configured to generate radiation such as EUV (extreme ultraviolet radiation). The EUV radiation may for example have a wavelength within the range of 5-20 nm, for example within the range of 13-14 nm, for example within the range of 5-10 nm such as 6.7 nm or 6.8 nm.

The fuel droplet generator comprises a nozzle, a fuel feed line, a reservoir, and a pumping device arranged to supply a flow of molten metal fuel from the reservoir through the fuel feed line and out of the nozzle as a stream of droplets. The pumping device may simply be a pressure generator applied to the reservoir to force the fuel in its molten state from the reservoir through the feed chamber and out of the outlet orifice of the nozzle a stream of droplets. Any other suitable pumping device may be used, such as a gear pump or the like.

The fuel droplet generator has a replaceable filter assembly in the fuel feed line, arranged to filter the molten metal fuel in use. Typically, the molten fuel may be molten tin.

The replaceable filter assembly comprises a rigid support plate having first and second opposed faces, with one or more channels, each extending from a respective first aperture in the first face through a respective second aperture in the second face, and supporting a filter membrane on the first face and extending over each first aperture of the first face. The filter membrane comprises mutually spaced holes therein, with each first aperture in the first face of the rigid support plate aligned with a plurality of the holes in the filter membrane to provide fluid connection between the plurality of holes and the respective channel. This enables the molten fuel to flow through the channels and holes in use, with the holes acting as a filter by preventing solid particulate contaminant in the metal fuel, having a width greater than the maximum hole width, from passing though the holes to reach the nozzle.

Suitably, the holes may have a maximum width that is less than the minimum width of the outlet orifice of the nozzle, whereby particulate matter allowed to pass though the holes should also pass through the nozzle outlet orifice without causing blockage. Typically, the holes and the outlet orifice may have circular cross sections, so that the width will equate to the diameter. Hence, the holes may have a diameter that is less than the diameter of the outlet orifice of the nozzle. By "maximum width" of a cross sectional area herein is meant the longest straight line extending across the cross sectional area whilst also passing through the centroid of the cross sectional area.

The fuel droplet generator may comprise a replaceable nozzle assembly comprising the nozzle, and a connector for connecting the nozzle assembly to the fuel feed line whereby the nozzle is in fluid connection with the fuel feed line, with the filter assembly retained in the connector in use. The connector may comprise interengaging connection portions of the fuel line and of the fuel nozzle acting together as the connector.

In one suitable arrangement, the connector may be adapted to releasably hold the filter assembly between the fuel feed line and an inlet orifice of the nozzle assembly in use.

In another suitable arrangement, the replaceable nozzle may be adapted to releasably hold the filter assembly between the fuel feed line and an inlet orifice of the nozzle assembly in use.

In another suitable arrangement, the filter assembly may be bonded to the inlet orifice of the nozzle assembly whereby the replaceable nozzle and the filter assembly form a unitary component.

The rigid support plate of the filter assembly may be a solid wafer, such as a wafer of semiconductor material, for instance a silicon wafer. Typically, the rigid support plate may be a single crystal semiconductor wafer, such as a single crystal silicon wafer.

The filter membrane may be of any suitable material capable of bonding to the first face of the rigid support plate, but is suitably of a material that is capable of being provided by growth such as epitaxial growth, oxidation or chemical vapour deposition onto the first face of the rigid support plate. For instance, if the rigid support plate is of silicon, the membrane may suitably be a membrane of say silica, alumina or silicon nitride. Preferably, the rigid support plate is of silicon and the membrane of silicon nitride.

The first apertures may suitably have a maximum width of 100 µm and the holes may suitably have a maximum width of 3 µm. The thickness of the rigid support plate is to provide strength and rigidity to the filter assembly, and may be, for instance, from 100 to 1000 µm, for instance from 200 to 600 µm, say 300 to 500 µm such as 380 µm. The filter membrane, which is supported on the first face of the rigid support plate, may be substantially thinner, such as 0.1 to 5 µm in thickness.

The entire filter assembly may be coated with a layer of material insoluble in the molten metal fuel (e.g., molten tin). For instance, the entire filter assembly, including the second face and the internal walls of the apertures, may be coated with a thin layer of silicon nitride. This layer may be less than 1 µm in thickness, for instance less than 0.5 µm thick or less than 0.2 µm thick.

Suitably, the insertion of the replaceable filter assembly is carried out under clean room conditions. By clean room conditions it is meant an environment that has a low level of airborne particulates. Typically this is specified by the number of particles of a specified size per cubic meter of air. By clean room conditions is meant at least ISO 6 (less than 8320 particles of diameter greater than or equal to 1 µm per cubic meter), preferably at least ISO 5 (less than 832 such particles per cubic meter), more preferably at least ISO 4 (less than 83 such particles per cubic meter).

When the filter assembly is bonded to the inlet orifice of the nozzle assembly whereby the replaceable nozzle and the filter assembly form a unitary component, such bonding of the filter assembly to the inlet orifice of the nozzle may be carried out under clean room conditions and the nozzle assembly with the bonded filter assembly may suitably be stored in a hermetically sealed package prior to insertion. Such bonding may be effected by a suitable bonding means such as thermal bonding, anodic bonding or by gluing.

Suitably, the filter assembly may be made by MEMS fabrication (micro-electro-mechanical systems fabrication). This typically involves techniques such as are conventionally used for integrated circuit fabrication applied to the manufacture of mechanical devices for so-called micromachining. For instance, the rigid support plate may be formed by etching of a wafer, such as a semiconductor wafer, under clean room conditions. For instance, the filter membrane may formed by growth of a membrane layer onto the first surface of the rigid support plate (for instance by epitaxial growth, chemical vapour deposition or by oxidation) and by etching of the membrane layer under clean room conditions, for instance to form the holes in the filter membrane.

Etching techniques such as chemical wet etching may be employed, using a patterned resist or mask layer to control the etching process. Isotropic or anisotropic etching may be employed, for instance dry etching using, say, reactive ion etching. One suitable technique capable of providing channels of substantially uniform width in the rigid support plate is so-called DRIE etching (Deep Reactive Ion Etching), for instance when the rigid support plate is of silicon. The etching of the silicon is performed, for instance, with $SF_6$/Oxygen etching combined with alternating side-wall passivation using deposition of $C_4F_8$.

Further features and advantages of the present invention, as well as the structure and operation of various embodiments of the present invention, are described in detail below with reference to the accompanying drawings. It is noted that the present invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 3A to 3C schematically depict a first embodiment of a filter assembly forming part of a radiation source according to the invention, which may form part of the lithographic apparatus shown in FIGS. 1 and 2;

FIGS. 4A to 4C schematically depict a second embodiment of a filter assembly forming part of a radiation source according to the invention, which may form part of the lithographic apparatus shown in FIGS. 1 and 2;

Figure 1:
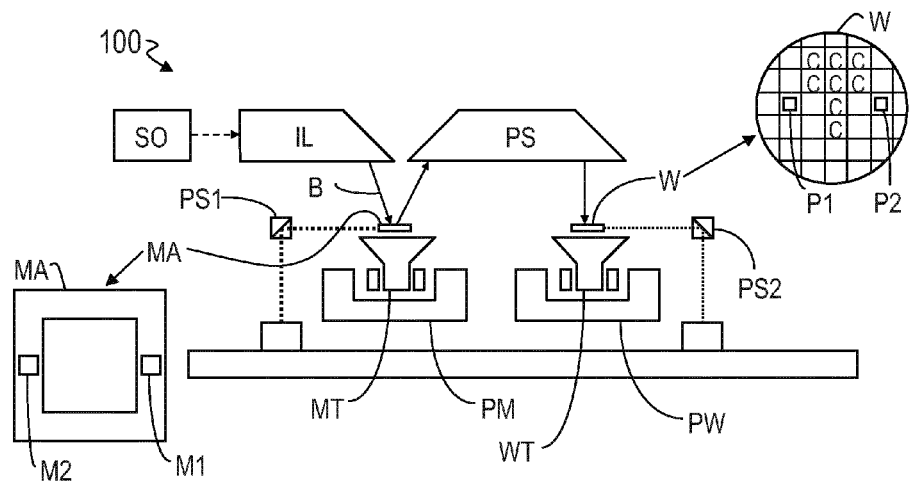
FIG. 1 schematically depicts a lithographic apparatus according to an embodiment of the invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the present invention. The scope of the present invention is not limited to the disclosed embodiment(s). The present invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

FIG. 1 schematically depicts a lithographic apparatus 100 including a source collector module SO according to one embodiment of the invention. The apparatus comprises:

an illumination system (illuminator) IL configured to condition a radiation beam B (e.g., EUV radiation).

a support structure (e.g., a mask table) MT constructed to support a patterning device (e.g., a mask or a reticle) MA and connected to a first positioner PM configured to accurately position the patterning device;

a substrate table (e.g., a wafer table) WT constructed to hold a substrate (e.g., a resist-coated wafer) W and connected to a second positioner PW configured to accurately position the substrate; and a projection system (e.g., a reflective projection system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam that is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since gases may absorb too much radiation. A vacuum environment may therefore be provided to the whole beam path with the aid of a vacuum wall and vacuum pumps.

As here depicted, the apparatus is of a reflective type (e.g., employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives an extreme ultraviolet (EUV) radiation beam from the source collector module SO. Methods to produce EUV radiation include, but are not necessarily limited to, converting a material into a plasma state that has at least one element, e.g., lithium or tin, with one or more emission lines in the EUV range. In one such method, often termed laser produced plasma ("LPP") the required plasma can be produced by irradiating a fuel, such as a droplet of material having the required line-emitting element, with a laser beam. The source collector module SO may be part of an EUV radiation source including a laser, not shown in FIG. 1, for providing the laser beam exciting the fuel. The resulting plasma emits output radiation, e.g., EUV radiation, which is collected using a radiation collector, disposed in the source collector module.

The laser and the source collector module may be separate entities, for example when a CO₂ laser is used to provide the laser beam for fuel excitation. In such cases, the radiation beam is passed from the laser to the source collector module with the aid of a beam delivery system comprising, for example, suitable directing mirrors and/or a beam expander. The laser and a fuel supply (i.e., fuel droplet generator) may be considered to comprise an EUV radiation source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g., mask) MA, the radiation beam B passes through the projection system PS, which focuses the beam onto a target portion C of the substrate W. With the aid of the second positioner PW and position sensor system PS2 (e.g., using interferometric devices, linear encoders or capacitive sensors), the substrate table WT can be moved accurately, e.g., so as to position different target portions C in the path of the radiation beam B. Similarly, the first positioner PM and another position sensor system PS1 can be used to accurately position the patterning device (e.g., mask) MA with respect to the path of the radiation beam B. Patterning device (e.g., mask) MA and substrate W may be aligned using mask alignment marks M1, M2 and substrate alignment marks P1, P2.

The depicted apparatus could be used in at least one of the following modes:

1. In step mode, the support structure (e.g., mask table) MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed.

2. In scan mode, the support structure (e.g., mask table) MT and the substrate table WT are scanned synchronously while a pattern imparted to the radiation beam is projected onto a target portion C (i.e., a single dynamic exposure). The velocity and direction of the substrate table WT relative to the support structure (e.g., mask table) MT may be determined by the (de-)magnification and image reversal characteristics of the projection system PS.

3. In another mode, the support structure (e.g., mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
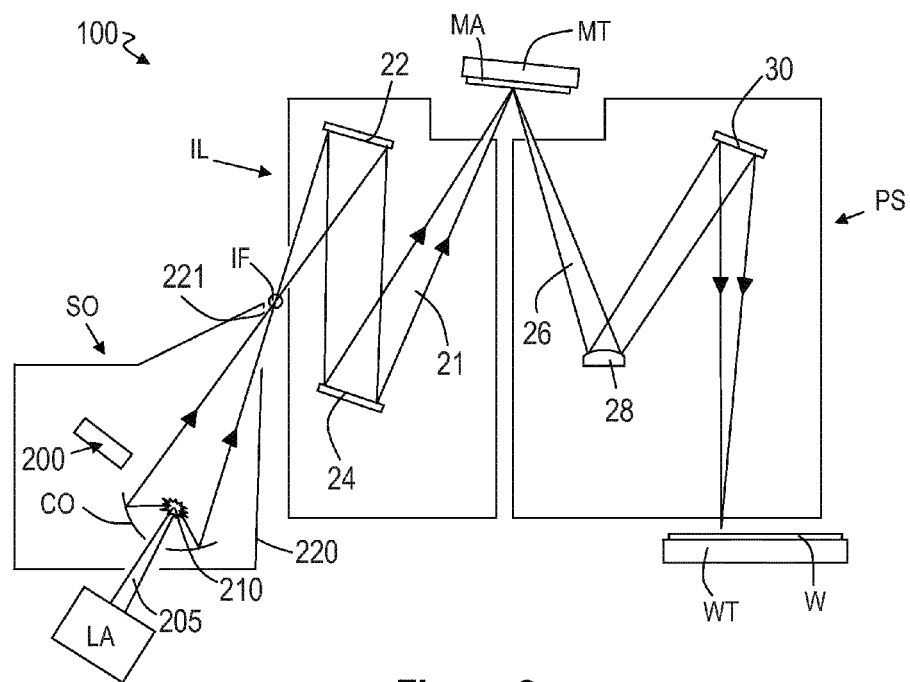
FIG. 2 is a more detailed view of the apparatus of FIG. 1, including an LPP source collector module.

FIG. 2 shows the apparatus 100 in more detail, including the source collector module SO, the illumination system IL, and the projection system PS. The source collector module SO is constructed and arranged such that a vacuum environment can be maintained in an enclosing structure 220 of the source collector module SO.

A laser LA is arranged to deposit laser energy via a laser beam 205 into a fuel, such as fuel droplets of tin (Sn) or lithium (Li) provided from a fuel supply or fuel droplet generator 200, thereby creating a highly ionized plasma 210 with electron temperatures of several 10's of eV. The energetic radiation generated during de-excitation and recombination of these ions is emitted from the plasma, collected and focussed by a near normal incidence collector optic CO.

A second laser (not shown) may be provided, the second laser being configured to preheat the fuel before the laser beam 205 is incident upon it. An LPP source that uses this approach may be referred to as a dual laser pulsing (DLP) source.

Radiation that is reflected by the collector optic CO is focused in a virtual source point IF. The virtual source point IF is commonly referred to as the intermediate focus, and the source collector module SO is arranged such that the intermediate focus IF is located at or near an opening 221 in the enclosing structure 220. The virtual source point IF is an image of the radiation emitting plasma 210.

Subsequently the radiation traverses the illumination system IL. The illumination system IL may include a facetted field mirror device 22 and a facetted pupil mirror device 24 arranged to provide a desired angular distribution of the radiation beam 21 at the patterning device MA, as well as a desired uniformity of radiation intensity at the patterning device MA. Upon reflection of the beam of radiation 21 at the patterning device MA, a patterned beam 26 is formed and the patterned beam 26 is imaged by the projection system PS via reflective elements 28, 30 onto a substrate W held by the substrate table WT.

More elements than shown may generally be present in the illumination system IL and projection system PS. Further, there may be more mirrors present than those shown in the Figures, for example there may be 1-6 additional reflective elements present in the projection system PS than shown in FIG. 2.

FIGS. 3A to 3C show schematically a first embodiment of a filter assembly for use in the invention. FIG. 3A shows a perspective overhead view with the second face of the rigid support plate 300 on top and the first face, supporting the filter membrane 304, underneath. FIG. 3B shows an expanded view of the channel 301 seen from above through the second aperture 303 in the second face of the rigid support plate 300. FIG. 3C provides a cross-sectional side view through the portion of the rigid support plate 300 and channel 301.

In this first embodiment, there is only a single channel 301 passing through the rigid support plate 300 from aperture 302 in the first face to aperture 303 in the second face. Holes 305 are present in the filter membrane 304 and a plurality of such spaced holes are present in the portion of membrane 304 extending across the aperture 302 in the first face of the rigid support plate 300.

For this first embodiment, the rigid support plate is a monocrystalline silicon wafer having a thickness of 380 μm with the diameter of the disc of the rigid support plate 300 being 3 mm. The dimensions of the first aperture in the first face of the rigid support plate are 90 μm×90 μm with the holes 305 in the filter membrane 304, extending across the first aperture 302, having a diameter of 0.8 μm and mutually spaced with a pitch of 5 μm. The thickness of the filter membrane layer 304 is 1.5 μm. The dimensions here are merely examples, and are not particularly critical so may be adjusted according to the particular application.

The membrane layer 304 is formed from a silicon nitride layer that was grown by low pressure chemical vapour deposition onto the first face of the monocrystalline silicon wafer prior to etching of the channel 301 or holes 305. The channel 301 was formed in the rigid support plates by anisotropic wet etching of the silicon using an etchant to which the silicon nitride layer 304 is resistant. This allowed the channel 301 to be formed with the filter membrane 304 still extending, substantially unetched, across the first aperture 302. Holes, 305, were subsequently etched into the filter membrane 304.

In the embodiment shown, the shape of the apertures is square, but other orientations of the monocrystalline silicon wafer may be used to provide different topographies for the channel(s) 301. For instance, a <100> silicon face can be used to provide square apertures or a <110> face for rectangular apertures such as slits. An advantage of apertures in the form of slits is that the slits may be mutually spaced more closely without excessive strength loss for the rigid support plate.

The anisotropic wet etching, carried out from the second face, using a mask with an opening at the second aperture 303, leads to the inverted truncated pyramidal shape of the channel 301 for the <100> silicon face used in the embodiment shown.

Although only one channel 301 is shown in this embodiment, a plurality of channels may be formed within a single filter assembly provided these are mutually spaced sufficiently far apart so that the structural rigidity of the support plate 300 is not excessively compromised. For the configuration shown, multiple channels could have a pitch, for instance, of 2 mm FIGS. 4A to 4C show schematically a second embodiment of a filter assembly for use with the invention. FIG. 4A shows a perspective overhead view with the second face of the rigid support plate 300 on top and the first face, supporting the filter membrane 304, underneath. FIG. 4B shows an expanded view of the channel 301 seen from above through the second aperture 303 in the second face of the rigid support plate 300. FIG. 4C provides a cross-sectional side view through the portion of the rigid support plate 300 and channels 301.

In this second embodiment, a plurality of channels 301 pass through the rigid support plate 300 from apertures 302 in the first face to respective apertures 303 in the second face. Holes 305 are present in the filter membrane 304 aligned with the first apertures 302 and a plurality of such spaced holes are present in the membrane 304 extending across each aperture 302 in the first face of the rigid support plate 300.

For this second embodiment, the rigid support plate is again a silicon wafer having a thickness of 380 μm with the diameter of the disc of the rigid support plate being 3 mm. The dimensions of the circular first apertures in the first face of the rigid support plate are 40 μm in diameter mutually spaced with a pitch of 80 μm with the holes 305 in the filter membrane 304, extending across each first aperture 302, having a diameter of 1.5 μm and mutually spaced with a pitch of 5μ. The thickness of the membrane is again 1 μm. As for the first embodiment, the dimensions are not particularly critical and may be varied according to the particular application, for instance to match the filter assembly size to the cross sectional area of the fuel feed line or inlet aperture of the nozzle assembly.

The membrane layer 304 is a silicon nitride layer that was grown onto the first face of the silicon wafer prior to etching of the channels 301 or holes 305. The channels 301 were formed in the rigid support plate 300 by DRIE etch technique as set out hereinbefore. The silicon nitride layer 304 is resistant to the DRIE etch. This allows the channels 301 to be formed with the filter membrane 304 still extending, substantially unetched, across the first apertures 302. Holes, 305, are subsequently etched into the filter membrane 304. The DRIE etching, carried out from the second face, using a mask with an opening at each second aperture 303, leads to channels 301 being formed having side walls substantially normal to the second and first faces of the rigid support plate 300.

Compared to the first embodiment, the DRIE etch process used, instead of a wet, anisotropic etch, permits the channels 301 to be packed more closely together without excessive loss in strength for the rigid support plate. This provides the potential advantage of a filter assembly capable withstanding high pressure differences across it yet with a large number of holes 305 for effecting filtration of the molten metal fuel.

The filter membrane may be of a suitable material capable of bonding to the first face of the rigid support plate, but is suitably of a material that is capable of being provided by growth such as epitaxial growth, chemical vapour deposition, oxidation or the like, onto the first face of the rigid support plate. This removes any requirement for bonding as the filter membrane may be grown in place and so be inherently bonded to the first face of rigid support plate 300. For instance, if the rigid support plate 300 is of silicon, the membrane may suitably be a layer of say silica, alumina or silicon nitride. Preferably, the rigid support plate is of silicon and the membrane of silicon nitride, as these materials may be conveniently independently etched to provide the filter assembly.

The relatively small diameter holes in the filter membrane 304 mean that it is preferable for the membrane 304 to have a thickness that is less than the diameter of the holes, so that a simple etching technique may be used for forming the holes. However, this may lead to the filter membrane being relatively fragile. The arrangement of the filter assembly of the invention allows a relatively thin membrane with holes of say 2 μm or less in diameter to be supported by the support plate on the first apertures of the channels, so that each portion of filter membrane that is subject to a pressure difference across it during use is sufficiently small in area so that the force developed across each portion can be sustained without the membrane fracturing.

The use of MEMS fabrication techniques permits such structures to be engineered under clean room conditions so that the risk of particulate contamination associated with conventional filters, where metal particles are inherently present, may be avoided or reduced.

The rigid support plate 300 should be engineered to withstand the forces developed during filtration of the molten metal fuel during use, because of the pressure drop across the filter assembly in use, and so the mutual spacing selected for the channels should allow for this. The use of isotropic etching such as DRIE to produce parallel-walled channels permits closer spacing of the channels to be achieved than would wet etching, allowing for a larger proportion of filtration area for a filter assembly of a certain size.

The entire filter assembly may be coated with a layer of material insoluble in the molten metal fuel such as a thin layer of silicon nitride. This layer may be less than 1 μm in thickness, for instance less than 0.5 μm thick. This layer is resistant to dissolution by molten metal fuel such as molten tin and may be conveniently deposited, for instance by plasma deposition or chemical vapour deposition, after the filter assembly has been etched to provide the channels and holes. This arrangement also lends itself to preparation under clean room conditions.

Figure 5:
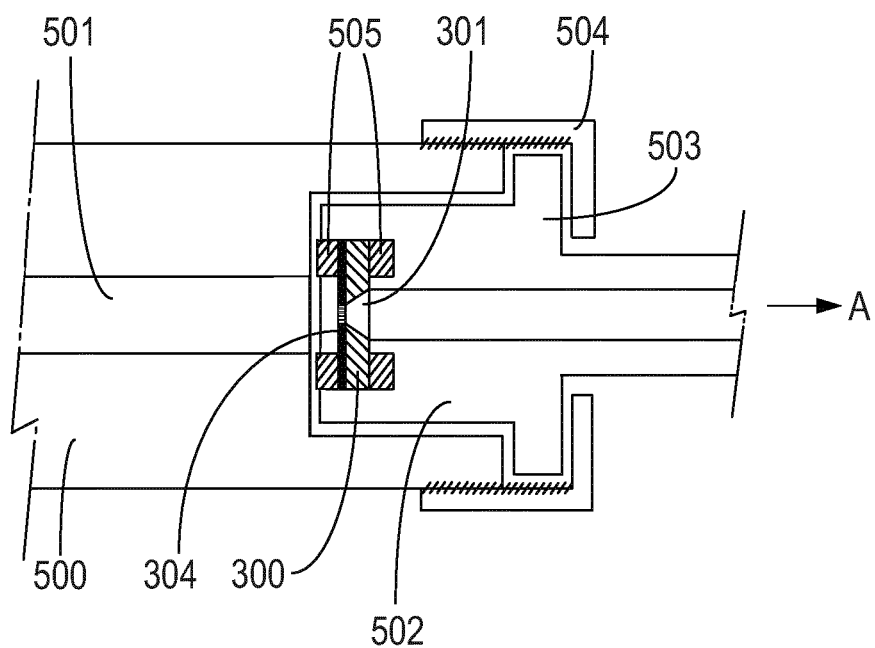
FIG. 5 shows schematically a cross sectional view through a portion of an embodiment of a fluid droplet generator according to the invention. The Figure shows a connection arrangement between a fuel feed line and a nozzle assembly.

FIG. 5 shows schematically a cross-sectional view of a portion of a first embodiment of a fuel droplet generator 200 suitable for use with the invention. This first embodiment of a fuel droplet generator comprises a fuel feed line 500 and a connector 502 showed fastened to the end of the fuel line. The connector 502 leads to a nozzle assembly with the fuel flowing in direction A as shown. The remainder of the nozzle assembly is not shown in the Figure. The distal end of the fuel line is threaded and an annular threaded cap 504 holds the collector in place, screwed onto the distal end of the fuel line and gripping shoulder 503 of the connector.

At the proximal end of the connector 502, a filter assembly of rigid support plate 300 and filter membrane 304 is held with channel 301 aligned so that the molten fuel 501 flowing from the fuel feed line 500 through the connector 502 passes through the channel 301 having first passed through the filter membrane 304. Seals 505, for instance polyimide seals engineered to resist the dissolution by the molten metal fuel, seal all the filter assembly 300 into the proximal end of the connector 502.

Hence, for this embodiment, the filter assembly is retained in the connector. Other modifications, falling within the scope of the invention, will be apparent from the preceding description. For instance, a particularly suitable arrangement has the filter assembly 300, 304 bonded to the end of the connector and the connector and filter assembly forming a part of a unitary replacement nozzle assembly. With such an arrangement, when the nozzle becomes blocked or worn, or when the filter becomes blocked, the entire nozzle assembly, including the filter, may be replaced as a unitary assemblage, avoiding the need for manipulation of seals that may risk contamination by particulate solid impurities.

Such a replacement nozzle assembly including a bonded filter assembly may be prepared under clean room conditions then transported for use in a hermetically sealed package, again to minimise risk of particulate contamination when the nozzle assembly is replaced.

For a typical nozzle, the nozzle may, for instance have a diameter at its outlet orifice of 10 microns, or 5 microns or 3 microns or any suitable value. Hence, the diameter of the holes 305 may be selected to be smaller than the nozzle diameter, say by having a diameter of 50% to 90% of the smallest diameter of the outlet orifice of the nozzle, so that particulates solid impurities of a size that may lead to nozzle blockage are trapped by the filter assembly.

The second aspect of the apparatus provides a lithographic apparatus comprising the radiation source of the first aspect of the invention, arranged to generate a radiation beam, and further comprising an illumination system configured to condition the radiation beam, a support constructed to support a patterning device, the patterning device being capable of imparting the radiation beam with a pattern in its cross-section to form a patterned radiation beam, a substrate table constructed to hold a substrate, and a projection system configured to project the patterned radiation beam onto a target portion of said substrate.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, LEDs, photonic devices, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The term "lens", where the context allows, may refer to any one or combination of various types of optical components, including refractive, reflective, magnetic, electromagnetic and electrostatic optical components.

The term "EUV radiation" may be considered to encompass electromagnetic radiation having a wavelength within the range of 5-20 nm, for example within the range of 13-14 nm, or example within the range of 5-10 nm such as 6.7 nm or 6.8 nm While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

It should be understood that while the use of words such as "preferable", "preferably", "preferred" or "more preferred" in the description suggest that a feature so described may be desirable, it may nevertheless not be necessary and embodiments lacking such a feature may be contemplated as within the scope of the invention as defined in the appended claims. In relation to the claims, it is intended that when words such as "a," "an," "at least one," or "at least one portion" are used to preface a feature there is no intention to limit the claim to only one such feature unless specifically stated to the contrary in the claim. When the language "at least a portion" and/or "a portion" is used the item can include a portion and/or the entire item unless specifically stated to the contrary.

The invention claimed is:

1. A radiation source having a fuel droplet generator configured to provide a stream of droplets of fuel at least one laser configured to vaporize at least some of said droplets of fuel, whereby radiation is generated, the fuel droplet generator comprising:

a nozzle;
a fuel feed line;
a reservoir;
a pumping device configured to supply a flow of molten metal fuel from the reservoir through the fuel feed line and out of the nozzle as a stream of droplets; and
a replaceable filter assembly in the fuel feed line and configured to filter said molten metal fuel in use, the replaceable filter assembly having a rigid support plate having first and second opposed faces, with one or more channels, each extending from a respective first aperture in the first face through a respective second aperture in the second face, and supporting a filter membrane on the first face and extending over each first aperture of the first face, wherein the filter membrane comprises mutually spaced holes therein, with each first aperture aligned with a plurality of the holes to provide fluid connection between the plurality of holes and the respective channel.

2. The radiation source of claim 1, wherein the fuel droplet generator comprises:
a replaceable nozzle assembly comprising the nozzle, and
a connector for connecting the nozzle assembly to the fuel feed line
whereby the nozzle is in fluid connection with the fuel feed line, wherein the filter assembly is retained in the connector in use.

3. The radiation source of claim 2, wherein the connector is adapted to releasably hold the filter assembly between the fuel feed line and an inlet orifice of the nozzle assembly in use.

4. The radiation source of claim 2, wherein the replaceable nozzle is adapted to releasably hold the filter assembly between the fuel feed line and an inlet orifice of the nozzle assembly in use.

5. The radiation source of claim 3, wherein the replaceable filter assembly is bonded to the inlet orifice of the nozzle assembly, whereby the replaceable nozzle and the filter assembly form a unitary component.

6. The radiation source of claim 1, wherein the rigid support plate is a silicon wafer.

7. The radiation source claim 1, wherein the filter membrane is a silicon nitride membrane.

8. The radiation source of claim 1, wherein the first apertures have a maximum width of 100 μm and the holes have a maximum width of 3 μm.

9. The radiation source of claim 1, wherein the replaceable filter assembly is coated with a layer of material insoluble in said molten metal fuel.

10. A lithographic apparatus, comprising:
the radiation source of claim 1;
an illumination system configured to condition the radiation beam;
a support constructed to support a patterning device, the patterning device being capable of imparting the radiation beam with a pattern in its cross-section to form a patterned radiation beam;
a substrate table constructed to hold a substrate, and
a projection system configured to project the patterned radiation beam onto a target portion of said substrate.

11. A fuel droplet generator for providing a stream of droplets of fuel for use in a radiation source for device lithography, the fuel droplet generator comprising a nozzle, a fuel feed line, a reservoir, and a pumping device arranged to supply a flow of molten metal fuel from the reservoir through the fuel feed line and out of the nozzle as a stream of droplets,
wherein the fuel droplet generator has a filter assembly in the fuel feed line, arranged to filter said molten metal fuel in use,
the filter assembly comprising a rigid support plate having first and second opposed faces, with one or more channels, each extending from a respective first aperture in the first face through a respective second aperture in the second face, and
supporting a filter membrane bonded to the first face and extending over each first aperture of the first face,
wherein the filter membrane comprises mutually spaced holes therein, with each first aperture aligned with a plurality of the holes to provide fluid connection between the plurality of holes and the respective channel.

12. A method for filtering a molten metal fuel supply for a fuel droplet generator for providing a stream of droplets of molten metal fuel to provide a radiation source, by laser excitation, for device lithography, the fuel droplet generator comprising a nozzle, a fuel feed line, a reservoir, and a pumping device arranged to supply a flow of molten metal fuel from the reservoir through the fuel feed line and out of the nozzle as a stream of droplets, the method comprising:
inserting and retaining a replaceable filter assembly in the fuel feed line, arranged to filter the molten metal fuel in use, the replaceable filter assembly comprising a rigid support plate having first and second opposed faces, with one or more channels, each extending from a respective first aperture in the first face through a respective second aperture in the second face, and
supporting a filter membrane on the first face and extending over each first aperture of the first face,
wherein, the filter membrane comprises mutually spaced holes therein, with each first aperture aligned with a plurality of the holes to provide fluid connection between the plurality of holes and the respective channel.

13. The method of claim 12, wherein the insertion of the replaceable filter assembly is carried out under clean room conditions.

14. The method of claim 12, wherein the fuel droplet generator comprises a replaceable nozzle assembly comprising the nozzle, and a connector for connecting the nozzle assembly to the fuel feed line whereby the nozzle is in fluid connection with the fuel feed line, wherein the filter assembly is retained in the connector in use.

15. The method of claim 14, wherein the connector is adapted to releasably retain the filter assembly between the fuel feed line and an inlet orifice of the nozzle assembly in use.

16. The method of claim 14, wherein the replaceable nozzle is adapted to retain the filter assembly between the fuel feed line and an inlet orifice of the nozzle assembly in use.

17. The method of claim 12, wherein the replaceable filter assembly is bonded to the inlet orifice of the nozzle assembly whereby the replaceable nozzle and the filter assembly form a unitary component.

18. The method of claim 17, wherein the filter assembly is bonded to the inlet orifice of the nozzle under clean room conditions and stored in a hermetically sealed package prior to insertion.

19. The method of claim 12, wherein the rigid support plate is formed by etching of a wafer under clean room conditions.

20. The method of claim 19, wherein the filter membrane is formed by growth of a membrane layer onto the first surface and etching of the membrane layer under clean room conditions.

* * * * *